(12) United States Patent

Nikonov et al.

(10) Patent No.: US 8,697,454 B2
(45) Date of Patent: Apr. 15, 2014

(54) METHODS OF FORMING SPIN TORQUE DEVICES AND STRUCTURES FORMED THEREBY

(71) Applicants: Dmitri E. Nikonov, Beaverton, OR (US); George I. Bourianoff, Austin, TX (US); Ajey P. Jacob, Marina Del Ray, CA (US)

(72) Inventors: Dmitri E. Nikonov, Beaverton, OR (US); George I. Bourianoff, Austin, TX (US); Ajey P. Jacob, Marina Del Ray, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/901,807

(22) Filed: May 24, 2013

(65) Prior Publication Data

US 2013/0256818 A1    Oct. 3, 2013

Related U.S. Application Data

(63) Continuation of application No. 12/456,581, filed on Jun. 18, 2009, now Pat. No. 8,450,818.

(51) Int. Cl.
*H01L 21/00*    (2006.01)
*H01L 29/82*    (2006.01)

(52) U.S. Cl.
USPC .............................................. 438/3; 257/422

(58) Field of Classification Search
USPC .................. 257/295, 422, E29.272, E29.324; 365/171–174; 438/3, 48
See application file for complete search history.

(56) References Cited

U.S. PATENT DOCUMENTS

| | | | |
|---|---|---|---|
| 6,480,412 B1 * | 11/2002 | Bessho et al. ................ | 365/173 |
| 6,611,034 B2 | 8/2003 | Den | |
| 6,807,091 B2 * | 10/2004 | Saito ........................... | 365/173 |
| 7,098,495 B2 | 8/2006 | Sun et al. | |
| 7,233,039 B2 | 6/2007 | Huai et al. | |
| 7,474,514 B2 | 1/2009 | Nishioka et al. | |
| 7,572,645 B2 | 8/2009 | Sun et al. | |
| 7,772,659 B2 | 8/2010 | Rodmacq et al. | |
| 7,986,544 B2 | 7/2011 | Kent et al. | |
| 8,053,244 B2 | 11/2011 | Ryan et al. | |
| 8,063,460 B2 | 11/2011 | Nikonov et al. | |
| 8,450,818 B2 * | 5/2013 | Nikonov et al. .............. | 257/421 |
| 2005/0040438 A1 | 2/2005 | Dobisz et al. | |
| 2007/0076469 A1 | 4/2007 | Ashida et al. | |
| 2008/0074799 A1 | 3/2008 | Ishiwata | |

(Continued)

FOREIGN PATENT DOCUMENTS

JP    2010-206023 A    9/2010
KR    10-2010-0091158 A    8/2010

(Continued)

OTHER PUBLICATIONS

Corrected Notice of Allowance received for U.S Appl. No. 12/456,581, mailed on Mar. 19, 2013, 2 pages.

(Continued)

*Primary Examiner* — Calvin Lee
(74) *Attorney, Agent, or Firm* — Forefront IP Lawgroup, PLLC

(57) ABSTRACT

Methods of forming spin torque microelectronic devices are described. Those methods may include forming a free FM layer on a substrate, forming a non-magnetic layer on the free FM layer, forming at least three input pillars on the non-magnetic layer, and forming an output pillar on the non-magnetic layer to form a majority gate device.

10 Claims, 16 Drawing Sheets

(56) References Cited

U.S. PATENT DOCUMENTS

| | | | |
|---|---|---|---|
| 2008/0121945 A1 | 5/2008 | Saito |
| 2008/0225583 A1 | 9/2008 | Guo et al. |
| 2009/0201614 A1 | 8/2009 | Kudo et al. |
| 2010/0053823 A1 | 3/2010 | Iwayama et al. |
| 2010/0142264 A1 | 6/2010 | Numata et al. |
| 2010/0200900 A1 | 8/2010 | Iwayama |
| 2010/0258887 A1 | 10/2010 | Zhu et al. |
| 2012/0153412 A1 | 6/2012 | Doyle et al. |
| 2013/0015543 A1 | 1/2013 | Gao et al. |

FOREIGN PATENT DOCUMENTS

| | | |
|---|---|---|
| KR | 10-2012-0021723 A | 3/2012 |
| WO | 2011/075257 A2 | 6/2011 |
| WO | 2011/075257 A3 | 9/2011 |
| WO | 2012/082403 A2 | 6/2012 |
| WO | 2012/087551 A1 | 6/2012 |
| WO | 2012/082403 A3 | 8/2012 |

OTHER PUBLICATIONS

Notice of Allowance received for U.S Appl. No. 12/456,581, mailed on Feb. 11, 2013, 8 pages.
Notice of Allowance received for U.S Appl. No. 12/456,581, mailed on Nov. 9, 2012, 9 pages.
Office Action received for U.S. Appl. No. 12/971,977, mailed on Jan. 29, 2013, 11 pages.
Braganca et al., "A Three-Terminal Approach to Developing Spin-Torque Written Magnetic Random Access Memory Cells," IEEE Transactions on Nanotechnology, vol. 8, No. 2, Mar. 2009, 6 pages.
Hosomi et al., "A Novel Nonvolatile Memory with Spin Torque Transfer Magnetization Switching: Spin-RAM", Electron Devices Meeting, IEDM Technical Digest, IEEE 2005, pp. 459-462.
Kishi et al., "Lower-current and Fast switching of a Perpendicular TMR for High Speed and High density Spin-Transfer-Torque MRAM", Electron Devices Meeting, IEEE Xplore, Dec. 15-17, 2008, 4 Pages.
Mangin et al., "Current-Induced Magnetization Reversal in Nanopillars With Perpendicular Anisotropy", Magnetics Conference 2006, INTERMAG, IEEE International, May 8-12, 2006, 5 pages.
Matsunaga et al., "Fabrication of a Nonvolatile Full Adder Based on Logic-in-Memory Architecture Using Magnetic Tunnel Junctions", Applied Physics Express 1, 2008, 3 pages.
International Preliminary Report on Patentability and Written Opinion Received for PCT Patent Application No. PCT/US2010/056735, Mailed on Jun. 28, 2012, 8 pages.
International Search Report and Written Opinion Received for PCT Patent Application No. PCT/US2010/056735, Mailed on Jul. 28, 2011, 9 pages.
International Search Report and Written Opinion Received for PCT Patent Application No. PCT/US2011/063072, Mailed on Jun. 20, 2012, 10 pages.
International Search Report and Written Opinion Received for PCT Patent Application No. PCT/US2011/063343, Mailed on Mar. 27, 2012, 11 pages.
Slavin, "Microwave sources: Spin-Torque Oscillators Get in Phase", Nature Nanotechnology, vol. 4, Aug. 2009, pp. 479-480.
Yoshikawa et al., Tunnel Magnetoresistance Over 100% in MgO-Based Magnetic Tunnel Junction Films With Perpendicular Magnetic L10-FePt Electrodes, IEEE Transactions on Magnetics, vol. 44, Issue 11, Nov. 2008, pp. 2573-2576.
Yuasa et al., "Giant Room-Temperature Magnetoresistance in Single-Crystal Fe/Mgo/Fe Magnetic Tunnel Junctions", Nature Materials, vol. 3 Issue: 12, 868-871.
International Preliminary Report on Patentability and Written Opinion received for PCT Patent Application No. PCT/US2011/063072, mailed on Jun. 27, 2013, 7 pages.
Office Action received for U.S Appl. No. 12/971.977, mailed on Sep. 18, 2013, 9 pages.
International Preliminary Report on Patentability and Written Opinion received for PCT Application No. PCT/US2011/063343, issued on Jun. 25, 2013, 7 pages.

\* cited by examiner

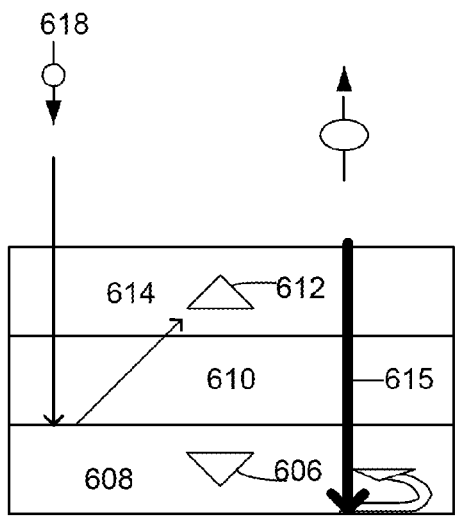
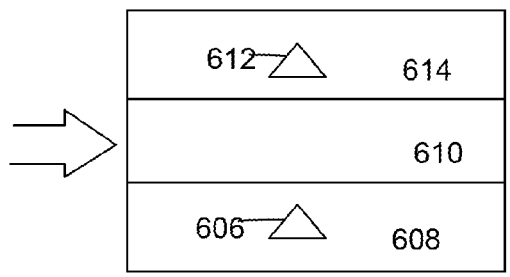
FIG. 6a          FIG. 6b
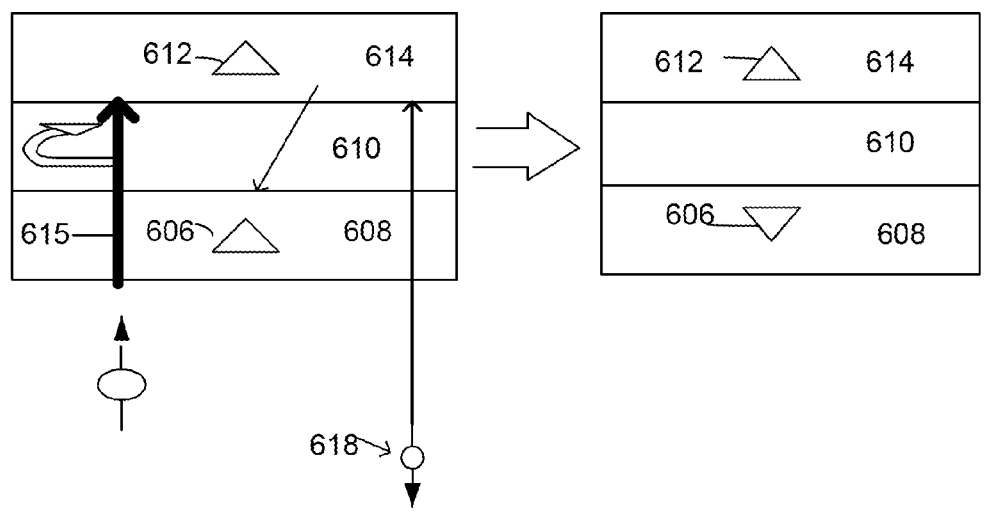
FIG. 6c          FIG. 6d

| 701 | 703 | 705 | 707 |
|---|---|---|---|
| A | B | C | Out |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

METHODS OF FORMING SPIN TORQUE DEVICES AND STRUCTURES FORMED THEREBY

RELATED APPLICATIONS

The present application is a Continuation of U.S. application Ser. No. 12/456,581 filed Jun. 18, 2009, now U.S. Pat. No. 8,450,818 issued May 28, 2013, entitled "METHODS OF FORMING SPIN TORQUE DEVICES AND STRUCTURES FORMED THEREBY"

BACKGROUND OF THE INVENTION

The operation of spin torque devices is based on the phenomenon of spin torque transfer. If a current is passed through a magnetization layer, called the fixed layer, it will come out spin polarized. This spin (which is angular momentum) will be added to the magnetization in a next magnetic layer, called the fixed layer, and will cause its precession. In the end, if the current exceeds a certain critical value (given by the magnetic material and its environment) the magnetization will be switched by a pulse of current, typically in about 1 nanosecond.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

FIGS. 6a-6d represent structures according to an embodiment.

FIG. 7 represents a logic function of a majority gate device according to embodiments.

DETAILED DESCRIPTION OF THE PRESENT INVENTION

Figure 1A:
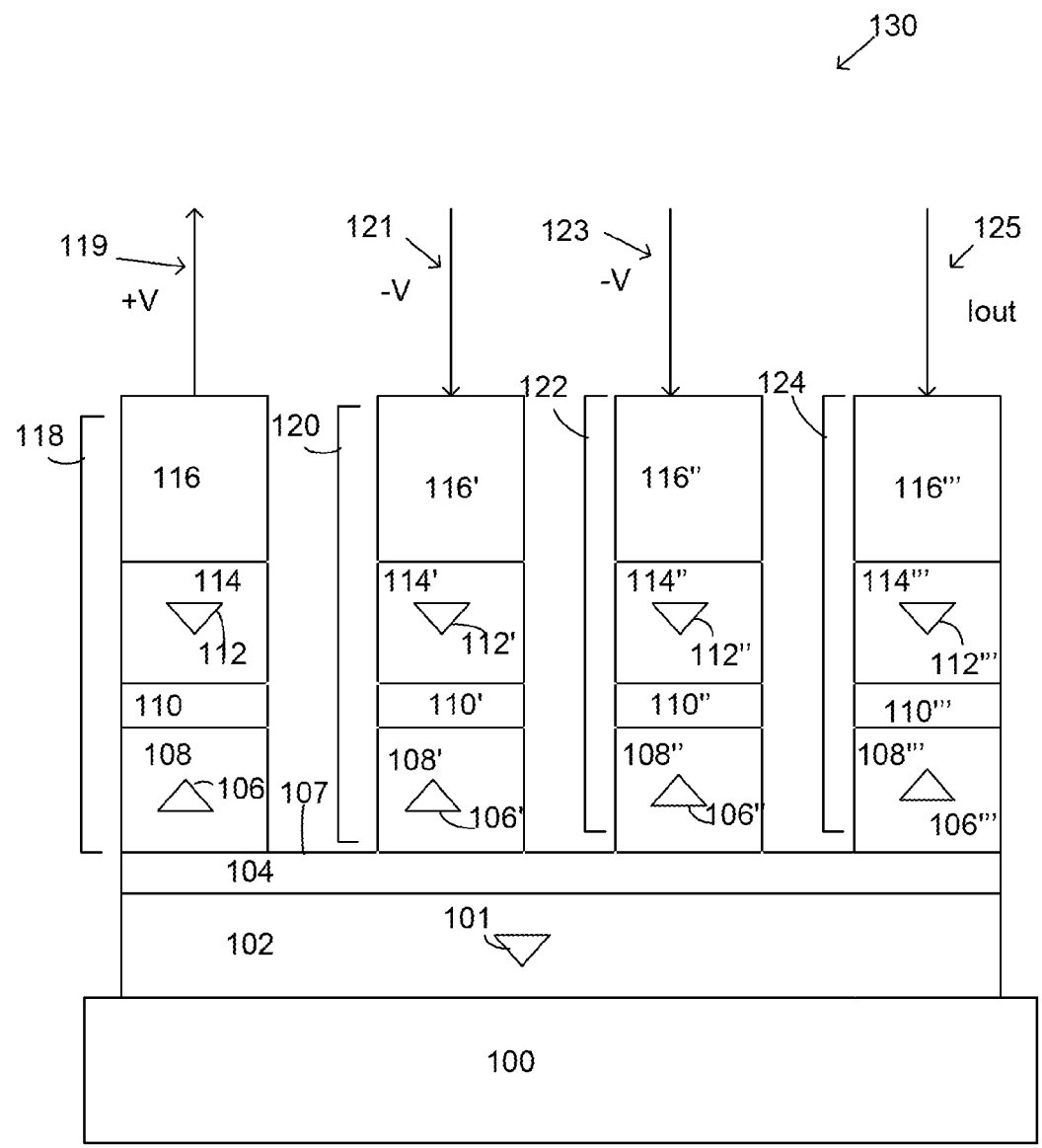
FIG. 1a-1b represent cross sections of a majority gate device according to an embodiment.
Figure 1B:
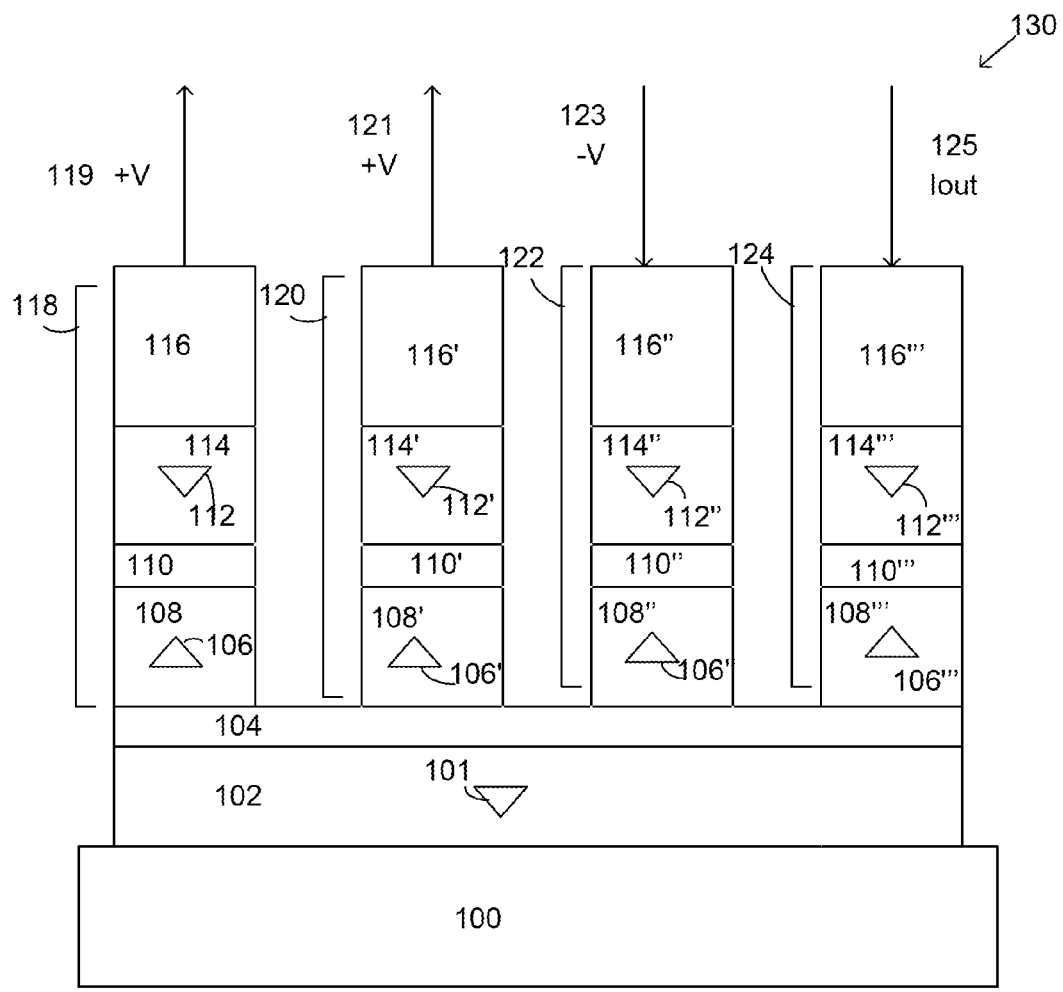

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals may refer to the same or similar functionality throughout the several views.

Methods and associated structures of forming and utilizing spin torque devices, such as a majority gate device, for example, are described. In an embodiment, one such method may comprise forming a free ferromagnetic layer on a substrate, forming a magnetic tunnel junction on the free ferromagnetic layer, and forming four independent ferromagnetic regions on the magnetic tunnel junction that are coupled to the free ferromagnetic layer. Methods of the present invention enable the fabrication of spin toque devices, including majority gate, nanowire and oscillator devices, for example.

FIGS. 1-9 illustrate embodiments of methods of forming a nanomagnetic structure, such as majority gate device structure, for example. FIG. 1a illustrates a substrate 100. In one embodiment, the substrate 100 may comprise a conductive material, such as a metallic material. In an embodiment, the substrate may comprise a metal layer of an integrated circuit. A free magnetic layer 102, such as a ferromagnetic (FM) layer 102, may be disposed on the substrate 100. The free FM layer 102 may comprise a ferromagnetic material, such as cobalt-iron alloy, or nickel-iron alloy, or platinum-iron alloy, for example. A direction of the magnetization 101 of the free FM layer 102 may be switched, i.e. its magnetization is switchable, as is known in the art. In an embodiment, the above magnetization direction may be in plane of the substrate. In another embodiment, the above magnetization direction may be perpendicular to the plane of the substrate.

A tunnel barrier 104, which in some cases may comprise a thin dielectric layer/non-magnetic layer, may be disposed on the free FM layer 102. The tunnel barrier 104 may comprise a metal layer such as copper, and may comprise a spin valve in some cases, and/or a tunneling barrier such as magnesium oxide, or any other suitable materials, depending upon the particular application. Four independent, first fixed FM regions 108, 108', 108'', 108''' may be disposed on a top surface 107 of the tunnel barrier 104. Each of the first fixed FM regions 108, 108', 108'', 108''' may comprise a magnetization state 106, 106', 106'', 106''. In an embodiment, the above magnetization directions may be parallel to the plane of the substrate. In another embodiment, the above magnetization directions may be perpendicular to the plane of the substrate. Each of the independent first fixed FM regions 108, 108', 108'', 108''' may have disposed on them exchange layers 110, 110', 110'' 110''' respectively. In an embodiment, the exchange layers may comprise non-magnetic layers, such as dielectric material in some cases. Each of the exchange layers 110, 110', 110'' 110''' may then have second fixed FM regions 114, 114', 114'', 114''' disposed on them respectively, as depicted in FIG. 1. Each of the second fixed FM regions 114, 114', 114'', 114''' may comprise a magnetization state 112, 112', 112'', 112'''. Four contacts (that may comprise a conductive material in some embodiments), 116, 116' 116'', 116''' may be disposed on the four second fixed FM regions 114, 114', 114'', 114''' respectively.

In an embodiment, an individual pillar/stack 118 comprising the contact 116 disposed on the second fixed FM region 114 that is disposed on the exchange layer 110 that is disposed on the first fixed FM region 108 may comprise an input 118 of a majority logic gate device 130. In a similar manner, the stacks 120, 122, may likewise comprise second and third inputs 120, 122 of the majority logic gate device 130. The pillar/stack 124 comprising the contact 116''' disposed on the second fixed FM region 114''', disposed on the exchange layer 110''' that is disposed on the first fixed FM region 108''' may comprise an output 124 of the majority logic gate device 130, in an embodiment.

Thus, in some embodiments, the majority gate device 130 may comprise three input pillars 118, 120, 122 and one output pillar 124, that are independent from one another and yet share electrical contact to the common free (switch-able) ferromagnetic layer 102. In other embodiments, the majority gate device 130 may comprise greater than three independent inputs disposed/attached to the common free FM layer 102. In an embodiment, the majority gate device may be disposed on a metal layer of an integrated circuit device.

Magnetization in the free FM layer 102 may be switched by currents generated from the three input regions 118, 120, 122 due to the spin torque transfer effect. In an embodiment, voltages 119, 121, 123 may be applied to the inputs 118, 120, 124 and a current 125 may be sensed in the output 124. The current sensed by the output 124 depends on the orientation of magnetizations in the free FM layer 102 and the output 124.

The operation of the majority gate device 130 is based on the phenomenon of spin torque transfer. When current is passed through a stack of magnetization layers, as in inputs 118, 120, 122, for example, the current will come out of the ferromagnetic material spin polarized. This spin (which is angular momentum will be added to the magnetization in the next FM layer and will cause its precession. If the current exceeds a certain critical value (given by the FM material and its environment) the magnetization will be switched by a pulse of current, typically in about 1 nanosecond.

Fixed ferromagnetic layers, such as the ferromagnetic regions 108, 114 of input 118, are not permitted to rotate through contact with another fixed FM layer by placing a very thin exchange coupling layer (such as the exchange layer 110 of input 118) between them, which may comprise such materials as ruthenium, for example. Together, two FM layers separated by the exchange coupling layer form a synthetic anti-ferromagnet, which has a much higher resistance to spin torque. In an embodiment, one or more of the layers 116, 116', 116'' may contain an antiferromagnetic material, such as platinum-manganese alloy, for example. The antiferromagnetic layers cause a higher resistance of layers 114, 114', or 114'' to spin torque via the effect of exchange bias.

If a flux of electrons flows from such a fixed magnetic layer to a free magnetic layer, it causes the magnetization of the latter to align parallel to magnetization of the former. This situation is depicted in FIG. 6a, wherein a larger flux of electrons 615 with magnetic moment parallel to magnetization 612 (majority carriers) and a smaller flux of electrons 618 with magnetic moments opposite to magnetization 612 (minority carriers) are flowing from a fixed FM layer 614 to a free FM layer 608 causing the free FM layer 608 magnetization 606 to align parallel to magnetization 612, as shown in the FIG. 6b. If a flux of electrons 615 with magnetic moments parallel to magnetization 612 and a flux of electrons 618 with magnetic moments opposite to magnetization 612 flow from the free layer 608 to the fixed layer 614 (as depicted in FIG. 6c), the free layer 608 magnetization 606 is aligned anti-parallel to magnetization 612, as shown in the FIG. 6d. This alignment is not dependent on the prior direction of magnetization. Therefore, a device fabricated according to embodiments herein does not require read-off before writing and does not require a reset before operation. In an embodiment, the two FM layers 608 and 614 separated by a nonmagnetic layer 610 may comprise a magnetoresistance stack such that the resistance of the stack is dependent on the relative directions of magnetizations 606 and 612. Critical current required for switching magnetization for devices utilizing magnetization perpendicular to the plane of substrate ("out-of-plane") may be on the order of 30 microamps, in some cases. In some cases, it is much less than typical currents of 1 milliamps for devices with magnetization parallel to the plane of substrate ("in plane"). The current by convention has the direction opposite to the direction of the electron flux, due to the negative charge of electrons.

Figure 2:
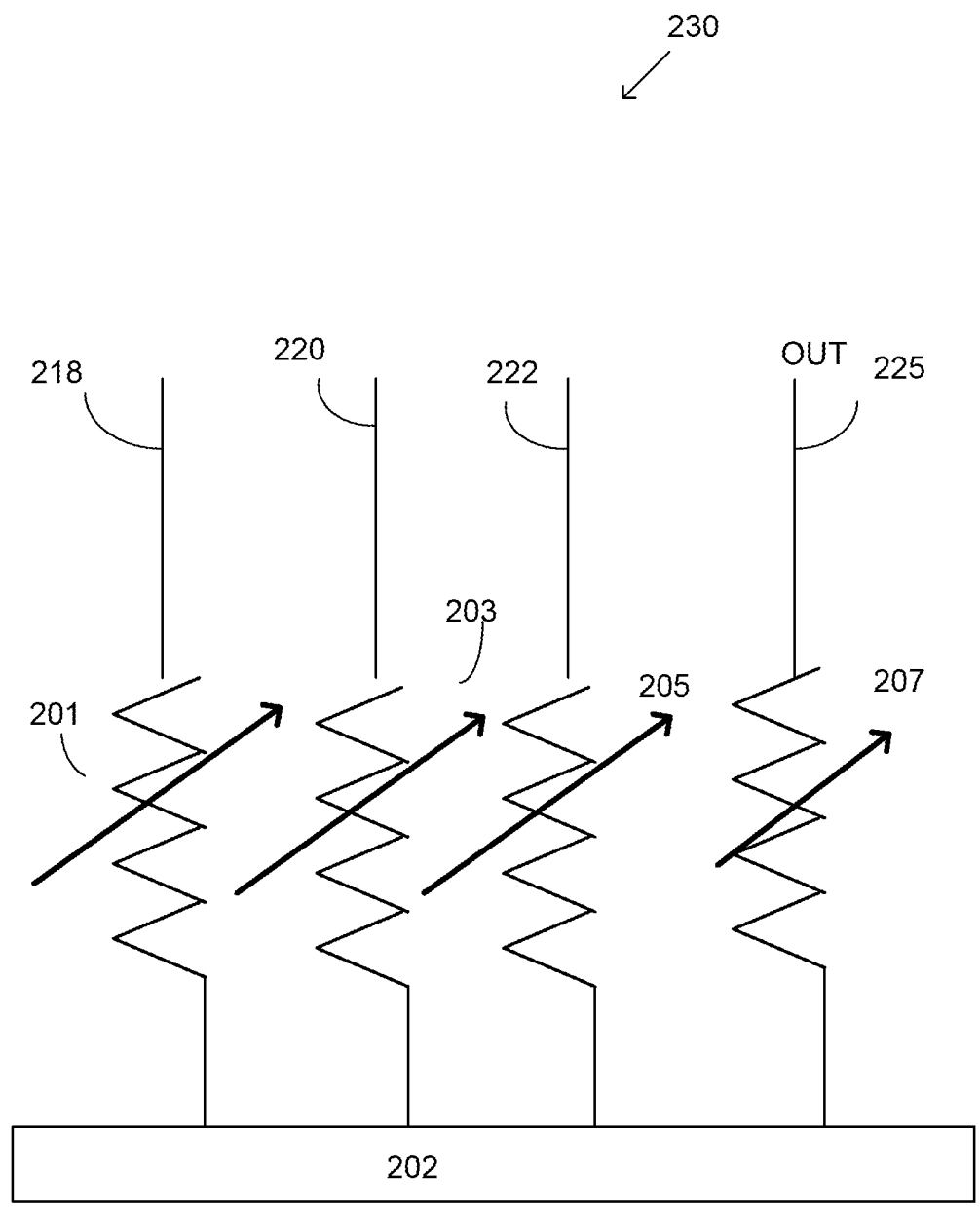
FIG. 2 represents an operation of a majority gate device according to an embodiment.

FIG. 2 shows the circuit diagram of the switching behavior of a circuit according to an embodiment. Magnetic tunnel junctions 201, 203, 205, and 207 are variable resistances of three input regions 218, 220, 222 (such as the three input regions 118, 120, 122 of FIG. 1a) and an output 225 (such as output 125 of FIG. 1a), respectively, of a majority gate device 230, similar to the majority gate device 130 of FIG. 1. The variable resistances depend on the relative magnetizations of a free FM layer and fixed FM regions, such as the free magnetic layer 102 and the fixed FM regions 108, 114 of FIG. 1a. Currents passing from inputs 218, 220, 224 to the common free FM electrode 202 may change the magnetization of the free layer in the majority gate device 230.

The state of output 225 is sensed by applying constant current across the common free FM electrode 202 and the output electrode. Here the effect of tunneling magnetoresistance is used. If the magnetizations of the free and the fixed layers are parallel, the resistance is low, for example on the order of 3 kOhm. If the magnetizations are anti-parallel, the resistance is higher by the factor of magnetoresistance (MR) which can be made as high as 300%-600%. Therefore the voltage developed across the stack changes: it is smaller for the state with low resistance, and larger for the state with higher resistance. The sense current can be made to be less than the critical current, and will not change the state of the majority gate in the next logical stage. Larger current may be more than the critical switching current and will change the state of the majority gate in the next logical state.

For example, at input, logical "0" is a positive voltage, and logical "1" is a negative voltage. At output, logical "0" is a lower current, and logical "1" is a higher current. Thus, applying two positive and one negative voltages, "0", "0" and "1" to the input electrodes switches the majority gate device to the anti-parallel state 101 and thus the current at the output is low ("0") (see FIG. 1b). Alternatively, applying one positive and two negative voltages to the input electrodes, "0", "1" and "1", switches the device to the parallel state (referring back to FIG. 1a) and thus the current at the output is high ("1"). Since in some embodiment, the majority gate device comprises 3 inputs and 1 output, it exhibits a truth table 700 as shown in FIG. 7, wherein 701, 703, 705 comprise inputs and 707 comprises an output 709 of a majority gate device according to embodiments of the present invention. If one of the inputs is set to 0, the output is a logical "AND" of the remaining two inputs. If it is set to 1, the output is the logical "OR" of the inputs. In an embodiment, a computational variable of the majority gate device may be encoded as a direction of magnetization.

Figure 3:
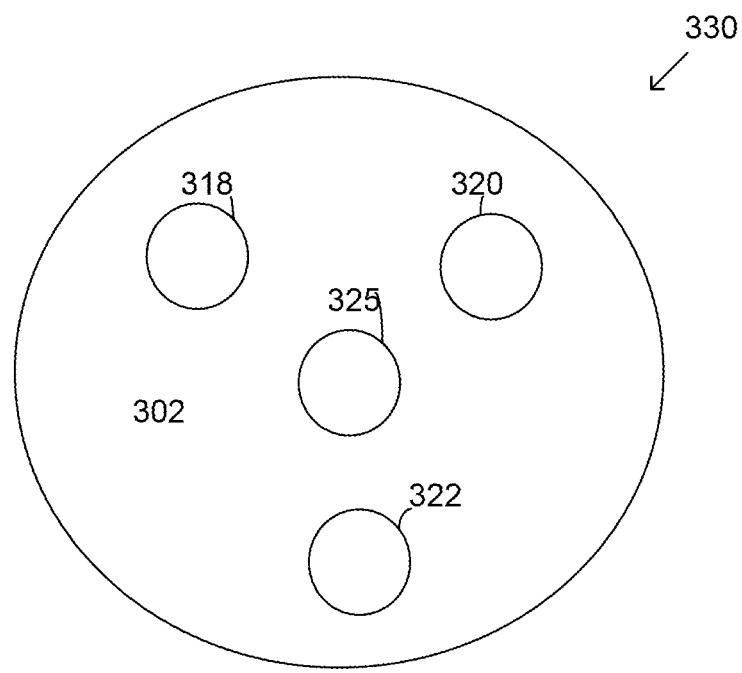
FIGS. 3-5 represent top views of a majority gate device according to embodiments.
Figure 4:
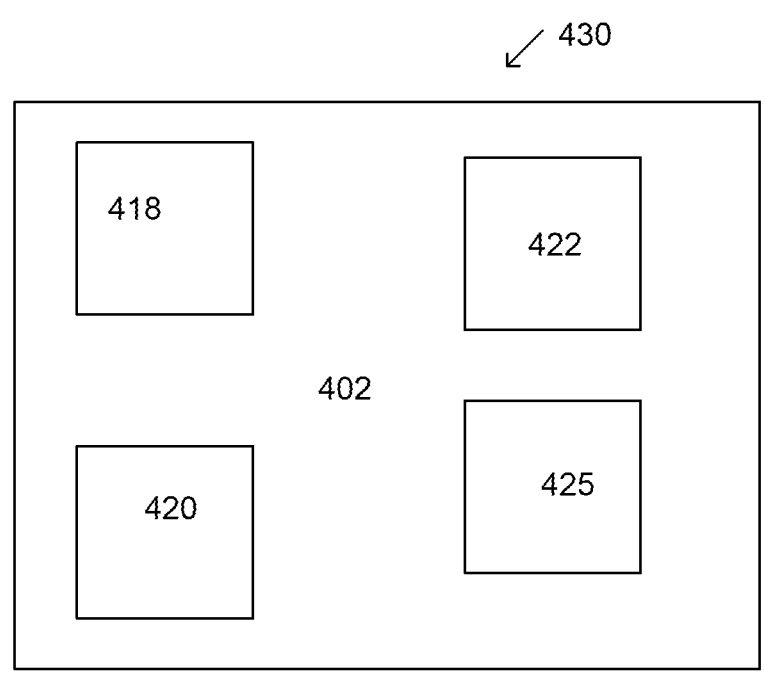
Figure 5:
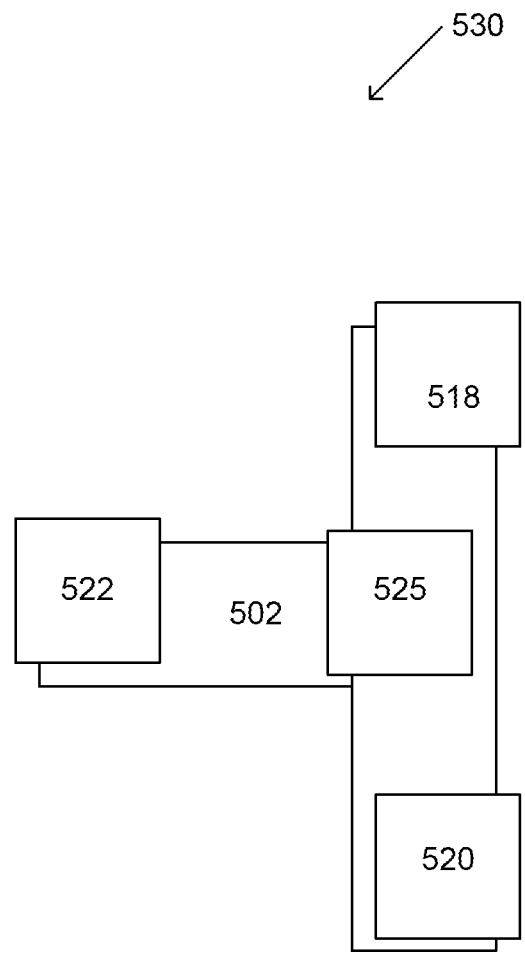

Various layouts of the majority gate device are presented in FIGS. 3, 4, and 5. In FIG. 3 (top view), three input electrodes 318, 320, 322 and one output electrode 325 are attached to a free FM layer 302 of a majority gate device 330, similar to the majority gate device 130 of FIG. 1. FIG. 3 depicts a top view of the layout of an embodiment. Electrodes are circular to avoid high gradients of magnetization in the corners of the FM regions and thus higher energy of magnetization states.

Circular electrodes are suitable for structures with out-of-plane magnetization, wherein the energy barrier between the states is caused by material anisotropy. In an embodiment with in-plane magnetization, all electrodes in FIG. 3 need to be elongated along a certain direction, i.e. will have elliptical shape. This shape would create a barrier between the logical states due to shape anisotropy.

FIG. 4 depicts a top view of the layout in another embodiment. Three input electrodes 418, 420, 422 and one output electrode 425 are attached to a free FM layer 402 of a majority gate device 430, similar to the majority gate device 130 of FIG. 1. The layout is optimized for the minimal area of the device with the size of each electrode equal to the minimal feature of the process node, F(feature)/2. FIG. 5 depicts a top view of the layout of another embodiment. Three input electrodes 518, 520, 522 and one output electrode 525 are attached to a free FM layer 502 of a majority gate device 530, similar to the majority gate device 130 of FIG. 1. The layout is optimized for faster switching time due to the smaller area of the free layer 502. For clarity, electrodes are off-set from their positions aligned to the edges of the bottom layer. Square electrodes are suitable for structures with out-of-plane magnetization, wherein the energy barrier between the states is caused by material anisotropy. In an embodiment with in-plane magnetization, all electrodes in FIG. 3 need to be elongated along a certain direction, i.e. will have rectangular shape. This shape would create a barrier between the logical states due to shape anisotropy.

Figure 8:
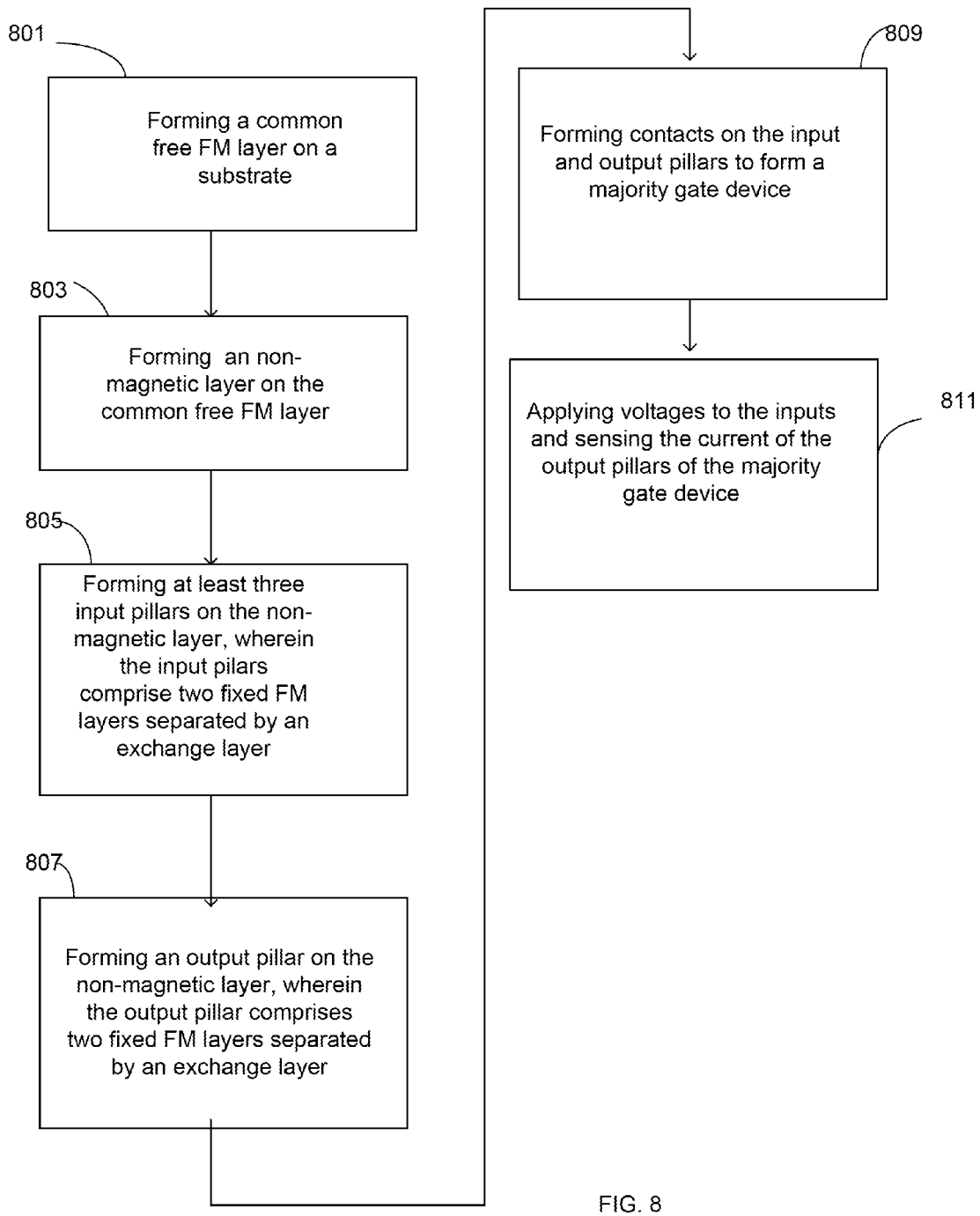
FIG. 8 represents a flow chart according to embodiments.

FIG. 8 depicts a flow chart of a method of forming a majority gate device, such as the majority gate device of FIG. 1a, for example. At step 801, a common free FM layer may be formed on a substrate. At step 803, a non-magnetic layer may be formed on the common free FM layer. At step 805, at least three input pillars may be formed on the non-magnetic layer, wherein the input pillars comprise two fixed FM layers separated by an exchange layer. At step 807, an output pillar may be formed on the non-magnetic layer, wherein the output pillar comprises two fixed FM layers separated by an exchange layer. In an embodiment, steps 805 and 807 are combined into one step. At step 809, contacts may be formed on the input and output pillars to form a majority gate device. At step 811 voltages may be applied to the input pillars and the current may be sensed of the output pillar of the majority gate device.

Figure 9:
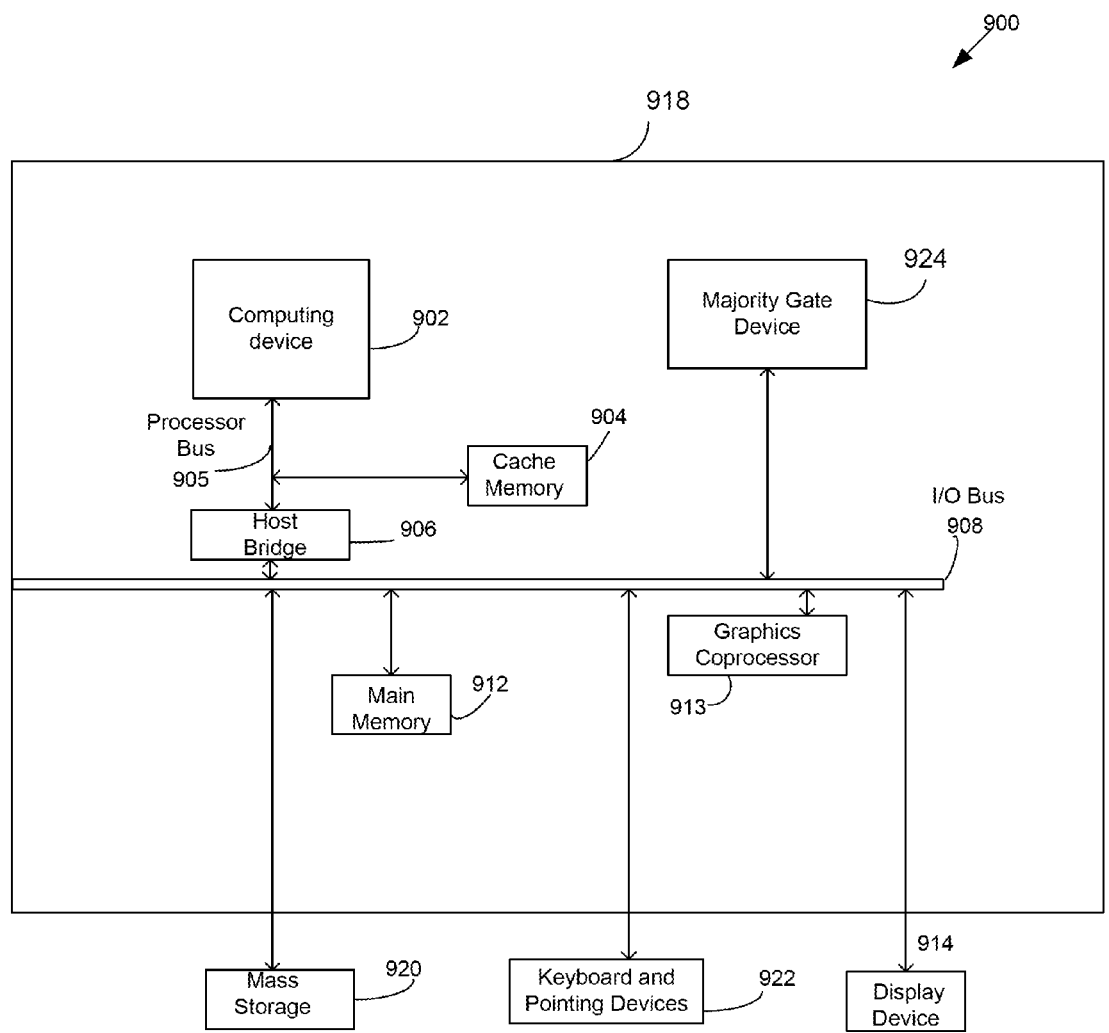
FIG. 9 represents a system according to embodiments.

FIG. 9 is a diagram illustrating an exemplary system 900 capable of being operated with microelectronic structures of the various embodiments, such as the majority gate device 130 of FIG. 1a, for example. It will be understood that the present embodiment is but one of many possible systems in which the majority gate of the various embodiments may be used.

In the system 900, a majority gate device 924 may be communicatively coupled to a printed circuit board (PCB) 918 by way of an I/O bus 908. The communicative coupling of the majority gate device 924 may be established by physical means, such as through the use of a package and/or a socket connection to mount the majority gate device 924 to the PCB 918 (for example by the use of a chip package, interposer and/or a land grid array socket). The majority gate device 924 may also be communicatively coupled to the PCB 918 through various wireless means (for example, without the use of a physical connection to the PCB), as are well known in the art.

The system 900 may include a computing device 902, such as a processor, and a cache memory 904 communicatively coupled to each other through a processor bus 905. The processor bus 905 and the I/O bus 908 may be bridged by a host bridge 906. Communicatively coupled to the I/O bus 908 and also to the majority gate device 924 may be a main memory 912. Examples of the main memory 912 may include, but are not limited to, static random access memory (SRAM) and/or dynamic random access memory (DRAM), and/or some other state preserving mediums. The system 900 may also include a graphics coprocessor 913, however incorporation of the graphics coprocessor 913 into the system 900 is not necessary to the operation of the system 900. Coupled to the I/O bus 908 may also, for example, be a display device 914, a mass storage device 920, and keyboard and pointing devices 922.

These elements perform their conventional functions well known in the art. In particular, mass storage 920 may be used to provide long-term storage for the executable instructions for a method for forming majority gate device in accordance with embodiments of the present invention, whereas main memory 912 may be used to store on a shorter term basis the executable instructions of a method for forming majority gate device in accordance with embodiments of the present invention during execution by computing device 902. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 912 may supply the computing device 902 (which may be a processor, for example) with the executable instructions for execution.

Benefits of the various embodiments include enablement of the fabrication of dynamically reconfigurable logic gates, whose functionality can be changed "on-the-fly", i.e. within several clock cycles. Non-volatile logic gates which may retain their state for years at a time, even when the power is switched off, may be realized. Application-specific circuits may be fabricated using the majority gates devices of the various embodiments.

Because the majority gate device of the various embodiments use magnetization of layers (rather than charge on a capacitor) to store the computation variable, there is an inherent memory function. Since the computational variable in a device according to the embodiments herein is encoded as direction of magnetization, it remains unchanged even after the power to the chip is switched off, similar to a magnetic memory element. The majority gate device of the embodiments uses spin torque to switch the ferromagnetic layers. The majority gate device utilizes three inputs and one output (vs. two inputs of prior art transistor structures). Majority gate spin torque devices of the various embodiments possess lower power dissipation and higher computational throughput than prior art devices.

In another embodiment, ferromagnetic semiconductor nanowire grating for nonvolatile memory and logic switches may be fabricated. In Magnetic RAM (MRAM), the logical bit in the memory cell is encoded by the relative directions of magnetization in two ferromagnetic layers separated by an insulator. The state with parallel magnetizations has a lower resistance than the state with anti-parallel magnetizations, according to the well-known giant magnetoresistance (GMR) effect. Switching is performed by the magnetic field of a current in a wire. Spin torque RAM (STRAM) devices are based on switching by spin torque (i.e. spin momentum transfer due to spin polarization of current coming out of a ferromagnetic layer).

STRAM still suffers from a relatively large current (about 1 mA) needed to switch the magnetization for the in-plane magnetization polarization. As a result, the switching energy and power dissipation of these prior art memory devices may be high. Use of a ferromagnetic semiconductor nanowire as an element of magnetic memory, according to the various embodiments found herein, enable the fabrication of sectioned nanowire structures, both horizontal and vertical, for faster spin torque switching. A dielectric gate may be formed for switching ferromagnetism on and off as well.

Figure 10A:
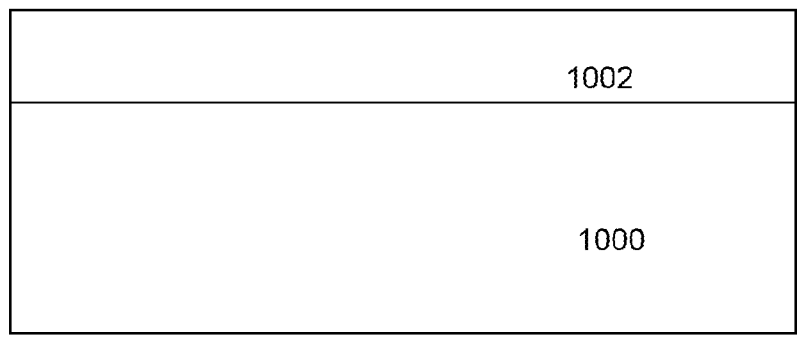
FIGS. 10a-10j represent cross sections of a nanowire structure according to embodiments.
Figure 10B:
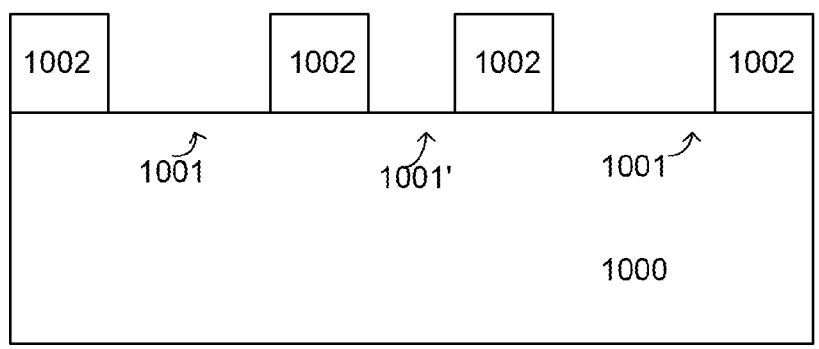

FIGS. 10a-10j illustrate embodiments of methods of forming a nanomagnetic structure, such as a ferromagnetic nanowire structure, for example. FIG. 10a illustrates a substrate 1000. In one embodiment, the substrate 1000 may comprise germanium, by illustration and not limitation. The substrate 1000 may comprise any type of suitable semiconductor material according to the particular application, in some embodiments. A thick layer of sacrificial oxide 1002 (e.g. Al2O3) may be deposited on the substrate 1000 and may then be subsequently patterned using any suitable patterning technique such as by utilizing a photolithographic technique, for example (FIG. 10b). The sacrificial oxide 1002 may be patterned into stripes of various width and separation, according to the particular application, resulting in various widths of exposed substrate 1001. For example, an exposed portion 1001 may comprise a larger width then an exposed portion 1001'.

Figure 10C:
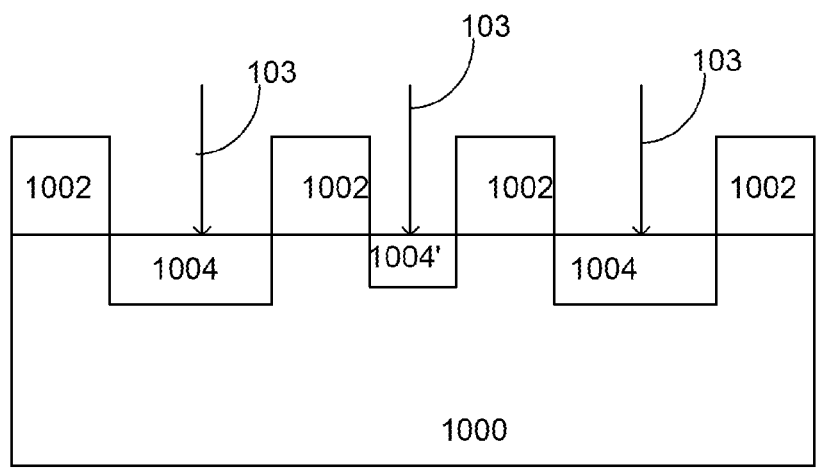
Figure 10D:
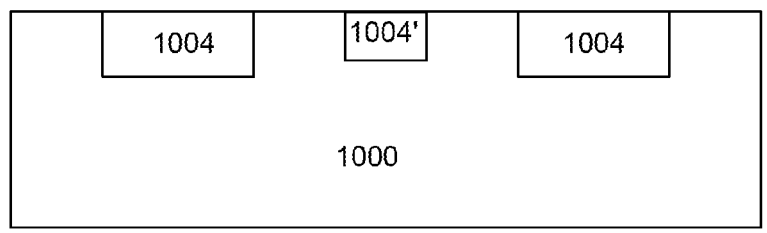
Figure 10E:
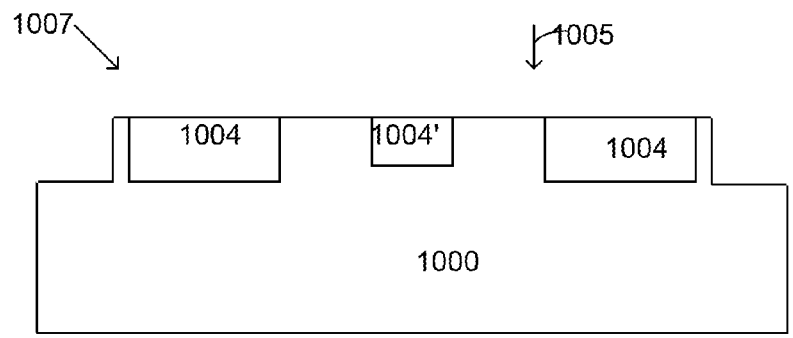

A species 103, such as manganese for example, may be ion-implanted into portions of the exposed substrate 1000 to form doped regions 1004 of the substrate 1000 (FIG. 10c). The doped regions may comprise ferromagnetic semiconductor regions, such as MnGe, for example. In some embodiments, the doped region 1004 may comprise a larger width than a width of the doped region 1004', according to the particular application. The sacrificial oxide 1002 may then be removed (FIG. 10d). The substrate 1000 and the doped regions 1004 may then be etched 105, utilizing a directional etching process, such as, but not limited to a reactive ion etching (RIE) process for example, in a direction perpendicular to the plane of the substrate 1000 to form a nanowire structure 1007 (FIG. 10e). In some embodiments, the interlaced sections of doped and non doped regions of the nanowire structure can also be fabricated by amorphization techniques, such as, for example, by exposing the substrate to a hydrogen atmosphere.

Figure 10F:
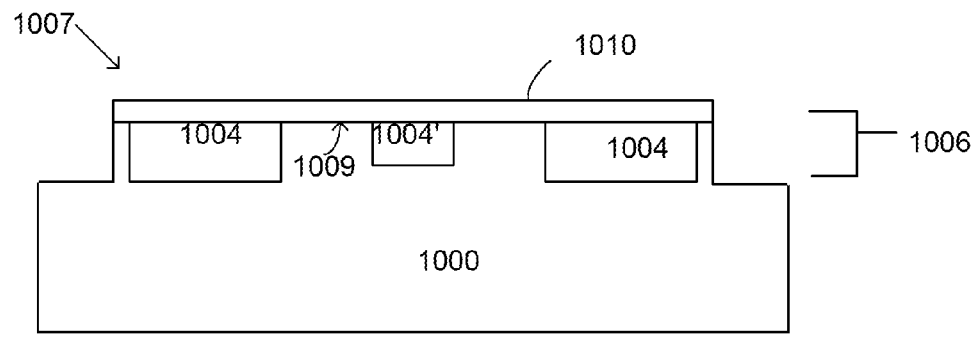

A thin gate dielectric 1010, which may comprise aluminum oxide, for example, may be deposited on a top surface 1009 of a raised portion 1006 of the substrate 1000 of the nanowire structure 1007 (FIG. 10f). A metal gate material may be subsequently formed over the gate dielectric 1010 (not shown). Thus the nanowire structure 1007 comprises both ferromagnetic and non-ferromagnetic sections in an alternating sequence, and electrodes attached to ends of the nanowire. In an embodiment, the nanowire structure 1007 may serve as an element of non-volatile magnetic memory through change in resistance due to magnetization orientation (magnetoresistance).

Figure 10G:
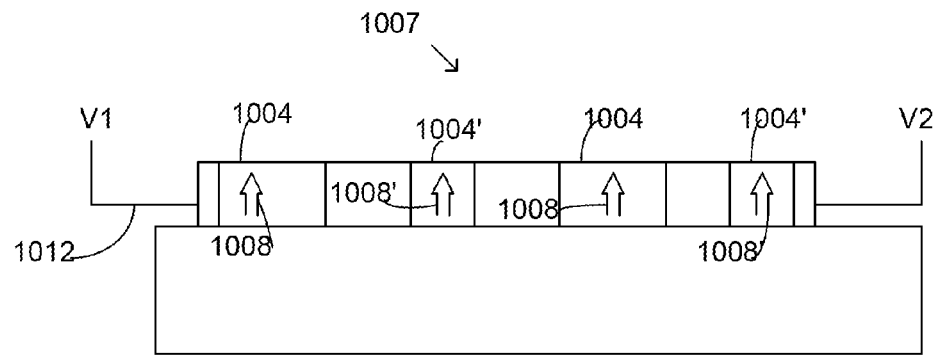

The nanowire structure 1007, may comprise a nanowire grating in some cases, or other types of nanowire devices. The smaller width doped regions 1004', which may comprise regions of free magnetization, may be subject to magnetization switching by spin torque. However the spin torque may not be sufficient to switch the larger width doped regions 1004, which may comprise fixed magnetization regions, in some cases. In an embodiment, a voltage 1012 may be applied along the nanowire structure 1007 to drive a current that may serve to switch the magnetization states 1008 of the doped regions 1004, (i.e. a "write" operation), and to sense the resistance of the cell/doped regions (a "read" operation) (FIG. 10g). Thus the nanowire structure 1007 comprises both ferromagnetic and non-ferromagnetic sections interlaced, and electrodes attached to ends of the nanowire. The nanowire structure 1007 may serve as an element of non-volatile magnetic memory through change in resistance due to magnetization orientation (magnetoresistance). The FIG. 10g depicts a lower-resistance state of the nanowire structure 1007, wherein magnetization states 1008 of the fixed doped regions 1004 and the magnetizations 1008' of the free doped regions 1004' comprise are parallel with each other.

Figure 10H:
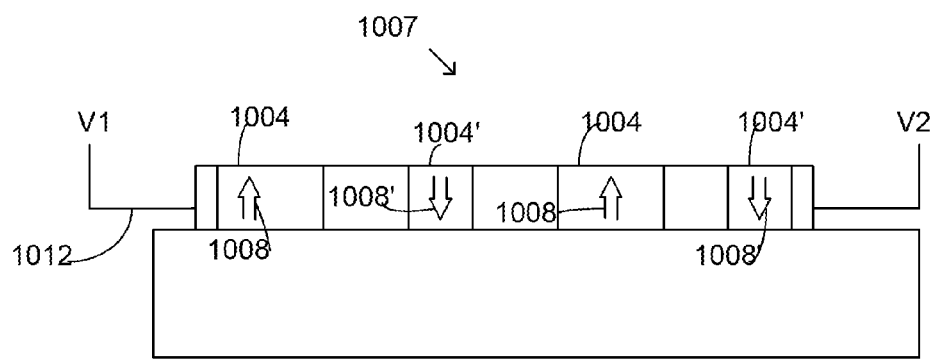
Figure 10I:
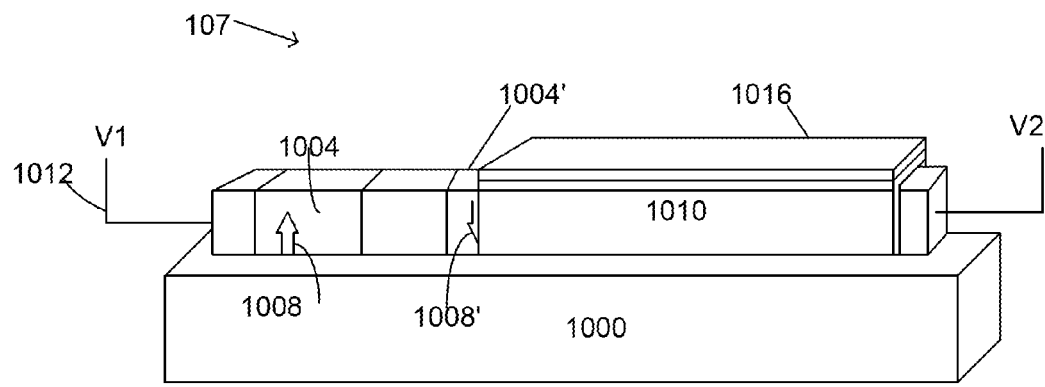

FIG. 10h depicts a higher-resistance state of the nanowire structure 1007 wherein the magnetizations 1008' of the free layers/doped regions 1004' are anti-parallel with those of the fixed layers/doped regions 1004. FIG. 10i depicts another embodiment of the nanowire structure 1007 further comprising a gate material disposed on the gate dielectric 1010. In an embodiment, a voltage 1012 may be applied along the nanowire structure 1007 to drive a current that may serve to switch the magnetization states 1008 of the doped regions 1004, and to sense the resistance of the cell/doped regions (a "read" operation). The dielectric-metal gate stack may apply voltage to the side of the nanowire to switch ferromagnetism on and off.

By forming a sectioned nanowire/grating structure comprising interlaced sections of a non-magnetic semiconductor (e.g. Ge) and a ferromagnetic semiconductor (e.g. MnGe), ferromagnetic devices are enabled which require low switching current and higher resistance than prior art metallic giant magnetoresistance GMR stacks. The nanowire devices of the various embodiments are compatible with a small switching current, high magnetoresistance ratio, in some cases greater than 100%, without the need of spin-filtering oxides, like MgO, used in prior art metal GMR stacks. Additionally, the nanowire device structures of the various embodiments possess small overall current due to small cross-sectional area of the device (in some cases 10 nm*10 nm).

Figure 10J:
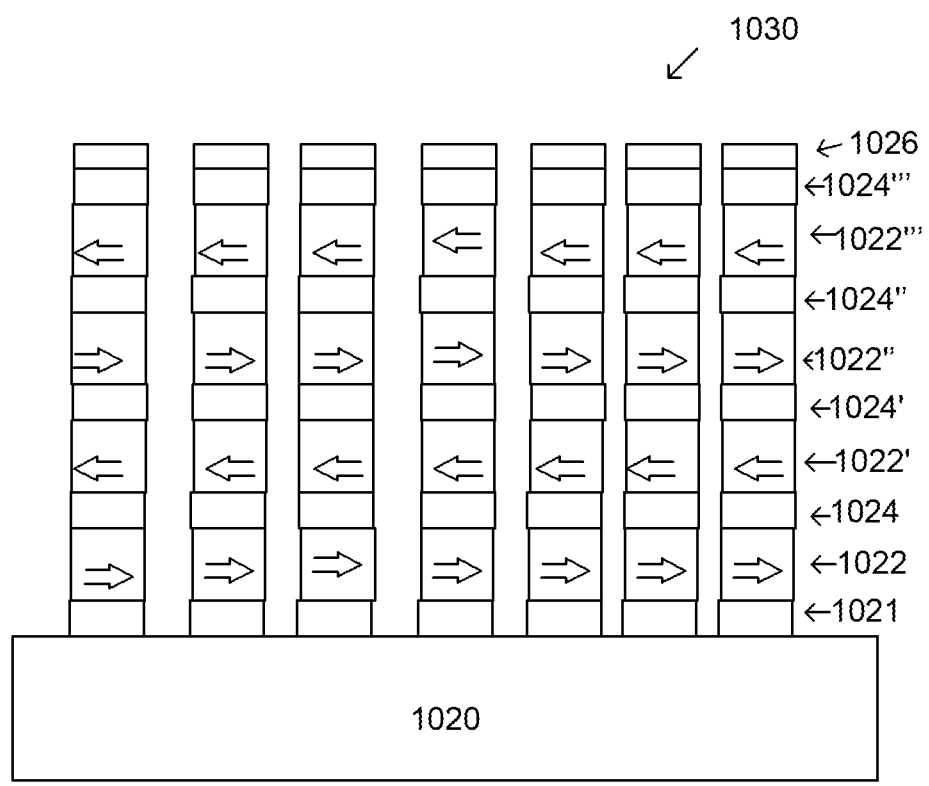

FIG. 10j depicts an array of vertical magnetic nanowires. A first row of magnetic material 1022 may be grown on a doped substrate 1020. The magnetic material 1022 may comprise any transition metal doped semiconductor material, any ferromagnetic semiconductor material, including any dilute metal semiconductor (DMS) material. The first row of magnetic material 1022 may be grown using a self assembly process, such as by utilizing a gold catalyst 1021 disposed on the substrate 1020, in an embodiment, or with out any catalysts, through low temperature chemical procedure, in other embodiments. In another embodiment, the first row of magnetic material 1022 may be grown utilizing a vapor liquid solid (VLS) and/or a vapor solid growth processes. The magnetic material 1022 may be doped by in-situ doping, in some cases. A first row of a non-magnetic material 1024 may be formed on the first row of magnetic material 1022. The first row of non-magnetic material 1024 may comprise hydrogen terminated amorphous region material, doped semiconductor and intrinsic semiconductor materials, in embodiments.

Subsequent rows of the magnetic material 1022 may be formed on subsequent rows of the non-magnetic material 1024 according to FIG. 10j, with a final row of metal contacts 1026 formed on the last row of non-magnetic material 1022, to form an array of vertical nanowires 1030. For example, a second row of magnetic material 1022' may be formed on the first row of non-magnetic material 1024, a second row of non-magnetic material 1024' may be formed on the second row of magnetic material 1022', a third row of magnetic material 1022" may be formed on the second row of non-magnetic material 1024', a third row of non-magnetic material 1024" may be formed on the third row of magnetic material 1022", and a fourth row of magnetic material 1022'" may be formed on the third row non-magnetic material 1024", followed by a fourth row of non-magnetic material 1024''' formed on the fourth row of the magnetic material 1022''', followed by a final row of metal contacts 1026. The area of prior art vertical GMR stacks is typically 100 nm*50 nm, while the nanowire device structures of the various embodiments possess small overall current due to small cross-sectional area of the device (in some cases 10 nm*10 nm). The current along the wire simultaneously switches several ferromagnetic layers, while it switches only one in prior art vertical GMR stacks.

Advantages of the various embodiments include avoiding high switching current and therefore high power dissipation present in prior art spin-torque magnetic memory devices. Prior art devices typically require switching current on the order of 1 mA and have a footprint of about 100 nm*50 nm. Memory devices fabricated according to the various embodiments can be switched with a low current of less than about 100 nA, and may comprise a footprint of about 100 nm*10 nm, while still maintaining about 100% magnetoresistance ratios.

Various embodiments comprise additional control for the ferromagnetism to be switched off by the gate, which may also change the resistance (referring to FIG. 10*i*, for example). Resistance-area product changes under the influence of the external magnetic field and (more importantly) current traversing the stack. Switching current density is much lower than in prior art metal-insulator spin torque stacks. At the same time magnetoresistance ratio is about 100%. The gate structure of the various embodiments provides another control of resistance, due to voltage control of the ferromagnetic state in the ferromagnetic semiconductor portions of the nanowire. If the gate voltage pushes the carrier out of the ferromagnetic semiconductor, it transitions to a paramagnetic state. The resistance of the nanowire/grating is then between the high and low states.

Figure 11A:
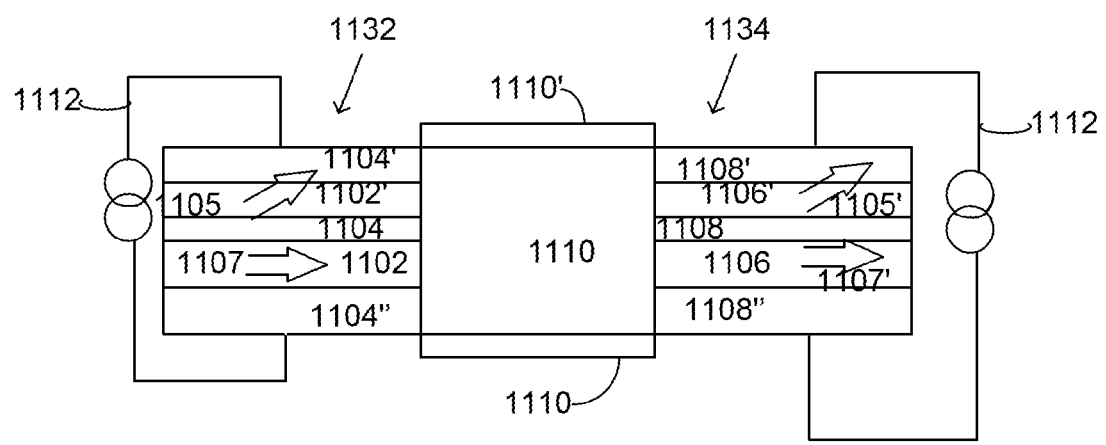
FIGS. 11a-11b represent cross sections of a phase locked oscillator structure according to embodiments.
Figure 11B:
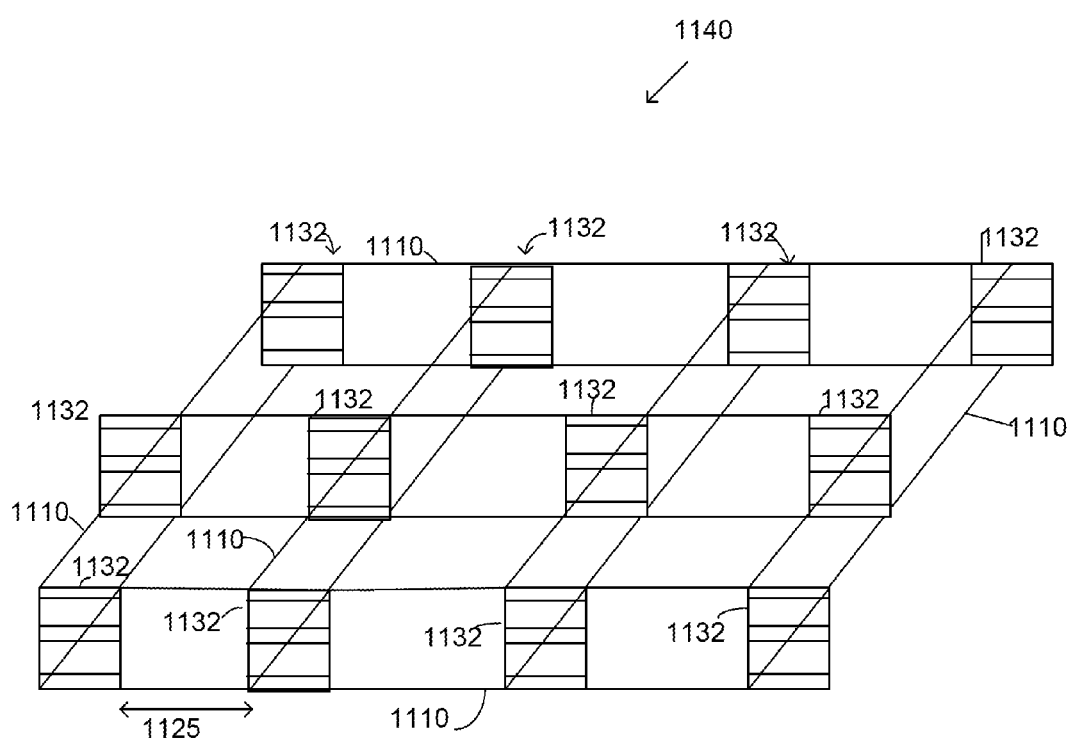
Figure 11C:
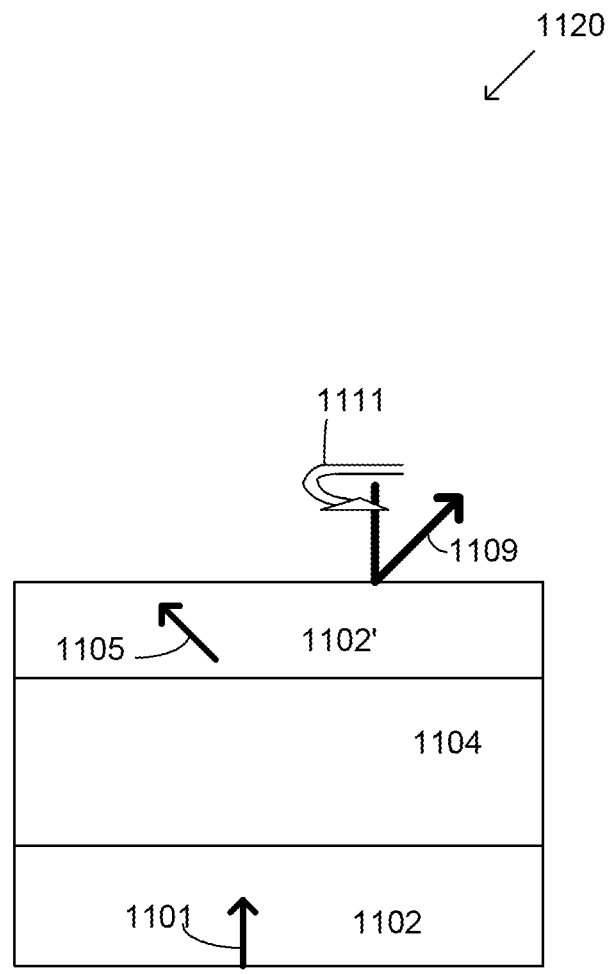
FIG. 11c represents a cross section of an oscillator according to the Prior Art.
Figure 8:
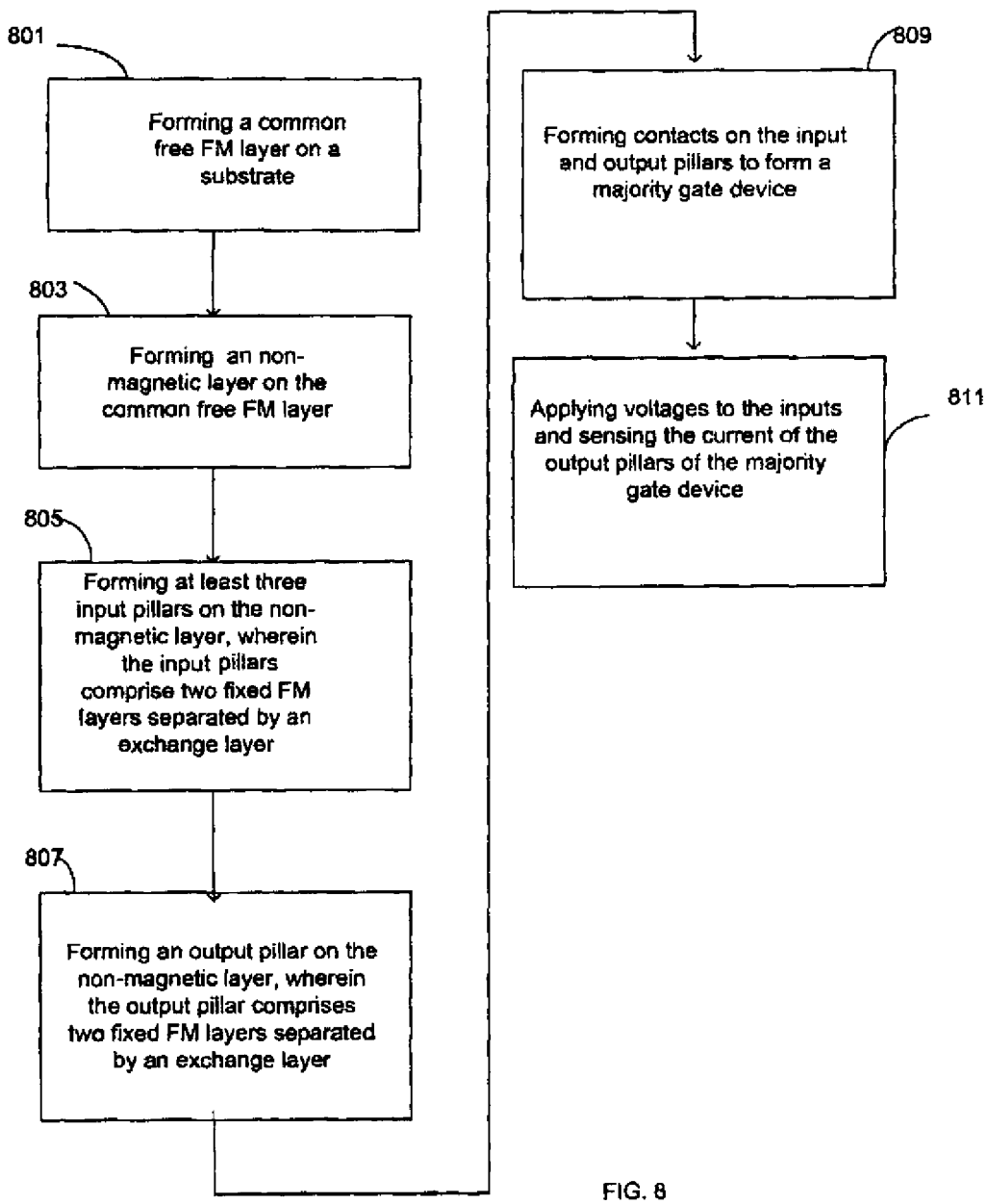

In another embodiment, phase-locked ferromagnetic oscillators for clocking applications may be fabricated. A spin torque oscillator is a structure consisting typically of two magnetic layers (one free and one fixed) separated by a non-magnetic layer. FIG. 11*c* depicts a prior art spin torque oscillator 1120, comprising two ferromagnetic metal layers 1102, 1102' separated by a non-magnetic layer 1104, wherein the non-magnetic layer 1104 may comprise a metal and/or an insulator material in some embodiments. The non-magnetic layer 1104 may comprise a tunnel junction. The ferromagnetic layer 1102 may comprise a fixed ferromagnetic layer, while the ferromagnetic layer 1102' may comprise a free ferromagnetic layer.

When a current 1101 is passed through the spin torque oscillator 1130 stack, it is spin polarized in the non-magnetic layer 1104 and thus carries a change of spin angular momentum 1111 (spin torque) to the free ferromagnetic layer 1102', in this example. The magnetization of the free layer 1109 then starts oscillating with a frequency of a few GHz. Since the free layer 1102' is not pinned by additional anti-ferromagnetic layers, it experiences precession of its direction of magnetization 1109. The frequency of these oscillations is controlled by the current. Since the resistance of the stack of layers of the oscillator 1130 depends on the relative orientations of the magnetizations of the free 1102' and the fixed layers 1102, the voltage across the stack also oscillates. Spin torque oscillators are typically small in size, and do not need an external magnetic field to operate. They exhibit low power consumption (less than about 0.1 mW) and clock frequency can be tuned by current magnitude. Thus the power of clock distribution may be decreased in a microprocessor.

In an embodiment, a first spin torque oscillator 1132 comprising two ferromagnetic metal layers 1102, 1102' with magnetization directions 1107, 1105 are separated by a non-magnetic layer 1104, may further comprise a top electrode 1104' and a bottom electrode 1104". A second spin torque oscillator 1134 comprising two ferromagnetic metal layers 1106, 1106' with magnetization directions 1107', 1105' are separated by a non-magnetic layer 1108, may further comprise a top electrode 1108' and a bottom electrode 1108". The bottom electrodes 1104", 1108" of the first and second spin torque oscillators 1132, 1134 may be connected to each other by a metal line 1110, such as by a microwave transmission line, for example. The top electrodes 1104', 1108' of the first and second spin torque oscillators 1132, 1134 may also be connected to each other by a metal line 1110', such as by a microwave transmission line. Thus, the first and second spin torque oscillators 1132, 1134 are connected by a pair of microwave transmission lines, in an embodiment.

As one of the spin torque oscillators 1132, 1134 oscillates, the voltage across the spin torque oscillator oscillates too. Part of this power may be coupled to the transmission lines 1110, 1110' and may be carried to other one of the spin torque oscillators 1132, 1134. There it modulates the applied current 1112 and thus exerts the oscillating force on the other one of the spin torque oscillators 1132, 1134. If the coupling is strong enough, the two oscillators 1132, 1134 do not oscillate independently. Instead they have a constant difference of phases (i.e. phase locking) and the same frequency. The necessary power in the transmission line to ensure phase locking may be optimized according to the particular application.

Prior art clocking circuits are typically hierarchical, wherein there is a central clock and the signal from it is split in an H-tree geometry and is delivered to local clocks in the blocks of CPU, as is known in the art. High power dissipation (currently about 30% of the total in a CPU) is associated with the circuitry used in distributing the clock signal. Also, this scheme suffers from clock skew and jitters due to process variations.

In an embodiment, an array/plurality of spin torque oscillators 1132 may form a distributed network of clocking, which does not have a central clock. The array of spin torque oscillators 1132 may comprise a rectangular pattern at a distance 1125 apart, which may comprise a few millimeters in some cases. In an embodiment, the distance may comprise less than about 250 millimeters. All clocks are still synchronized with each other due to the effect of phase-locking. They are connected by transmission lines. They oscillate at the same frequency and the phase between the clocks oscillations remains the same. This eliminates jitter and skew. The overall number of local clocks can be greater than 100 with the total consumed power of about 10 mW, in an embodiment.

Thus, the various embodiments may comprise oscillators based on spin torque and magnetization precession that are connected with microstrip transmission lines. Distribution of clocking signal may be achieved from local oscillators rather than prior art hierarchical clocking schemes. Tunable clocking circuits are enabled with a wide range of frequencies available, which can be used in a multitude of devices. Multiple oscillators in a grid pattern are connected and phase locked. The clocking signal may be delivered from a local oscillator to logic circuits located elsewhere in a microprocessor.

Low power for clock generation may be enabled, on the order of less than 0.1 mW per oscillator. Low power in clocking distribution, clocking signal generated in operation of oscillators. Nodes can be spaced less than about 1 mm distance apart. Further advantages include the exclusion of addi-

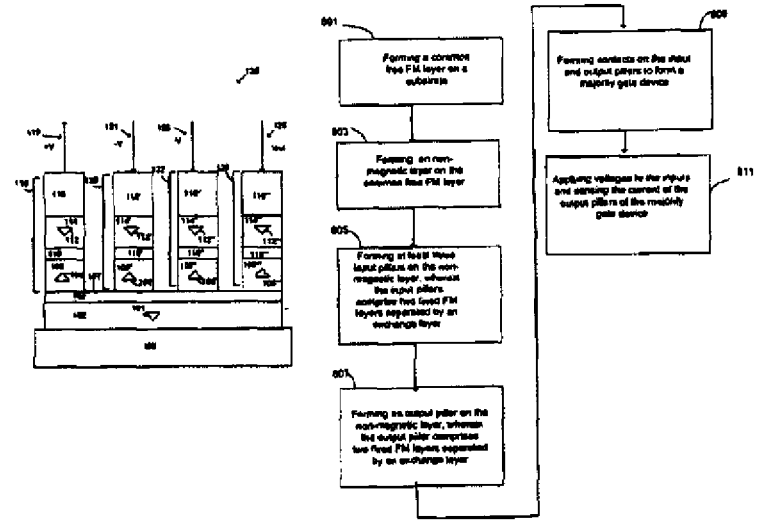

The invention claimed is:

1. A method comprising:
   forming a free FM layer disposed on a substrate;
   forming a non-magnetic layer disposed on the free FM layer;
   forming at least three input pillars disposed on the non-magnetic layer; and
   forming an output pillar on the non-magnetic layer to form a majority gate device,
   wherein each of the at least three input pillars and the output pillar comprise a first fixed FM layer disposed on the non-magnetic layer, an exchange layer disposed on the first fixed FM layer, and a second fixed FM layer disposed on the exchange layer, and a contact disposed on the second fixed FM layer.

2. The method of claim 1 further comprising wherein the at least three input pillars and the output pillar comprise two fixed FM layers separated by an exchange layer, wherein current is passed through one of the fixed FM layers of at least one of the at least three input pillars and the free FM layer.

3. The method of claim 1 further comprising wherein current is passed through one of the fixed FM layers of the output pillar and the free FM layer.

4. The method of claim 1 further comprising wherein a magnetization state in the free FM layer is switched by currents generated by the at least three input pillars due to the spin torque effect.

5. The method of claim 4 further comprising wherein the majority gate device comprises magnetic layers with magnetization perpendicular to the plane of the substrate.

6. The method of claim 4 further comprising wherein the magnetization state is detected by the change of the current in the output pillar.

7. The method of claim 1 wherein the majority gate device performs at least one logic operation by switching the magnetization state in the free FM layer.

8. The method of claim 1 further comprising wherein voltages are applied to the at least three input pillars and a current is sensed in the output pillar, wherein the current sensed by the output pillar is dependent on the magnetization state in the free FM layer.

9. The method of claim 1 wherein applying two positive and one negative voltage to the at least three input pillars causes the magnetization of the free FM layer to become anti-parallel.

10. The method of claim 1 wherein applying one positive and two negative voltages to the at least three input pillars causes the magnetization of the free layer to become parallel.

* * * * *

UNITED STATES PATENT AND TRADEMARK OFFICE
CERTIFICATE OF CORRECTION

PATENT NO. : 8,697,454 B2
APPLICATION NO. : 13/901807
DATED : April 15, 2014
INVENTOR(S) : Dmitri E. Nikonov et al.

It is certified that error appears in the above-identified patent and that said Letters Patent is hereby corrected as shown below:

Delete the title page and substitute the attached title page therefor.

On title page 2, item 56, in column 2, under "Other Publications", line 33, delete "12/971.977," and insert -- 12/971,977, --, therefor.

In the drawings

Delete drawing sheet 8 containing figure, and substitute the attached drawing sheet 8 therefor.

On sheet 8 of 16, in Figure 8, Reference Number 805, line 4, delete "pilars" and insert -- pillars --, therefor.

Signed and Sealed this
Fifteenth Day of July, 2014

Michelle K. Lee
*Deputy Director of the United States Patent and Trademark Office*

(12) United States Patent
Nikonov et al.

(10) Patent No.: US 8,697,454 B2
(45) Date of Patent: Apr. 15, 2014

(54) METHODS OF FORMING SPIN TORQUE DEVICES AND STRUCTURES FORMED THEREBY

(71) Applicants: Dmitri E. Nikonov, Beaverton, OR (US); George I. Bourianoff, Austin, TX (US); Ajey P. Jacob, Marina Del Ray, CA (US)

(72) Inventors: Dmitri E. Nikonov, Beaverton, OR (US); George I. Bourianoff, Austin, TX (US); Ajey P. Jacob, Marina Del Ray, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/901,807

(22) Filed: May 24, 2013

(65) Prior Publication Data
US 2013/0256818 A1 Oct. 3, 2013

Related U.S. Application Data

(63) Continuation of application No. 12/456,581, filed on Jun. 18, 2009, now Pat. No. 8,450,818.

(51) Int. Cl.
  H01L 21/00 (2006.01)
  H01L 29/82 (2006.01)
(52) U.S. Cl.
  USPC .................................. 438/3; 257/422
(58) Field of Classification Search
  USPC ............... 257/295, 422, E29.272, E29.324; 365/171–174; 438/3, 48
  See application file for complete search history.

(56) References Cited

U.S. PATENT DOCUMENTS

| | | | |
|---|---|---|---|
| 6,480,412 B1 * | 11/2002 | Bessho et al. ............ | 365/173 |
| 6,611,034 B2 | 8/2003 | Den | |
| 6,807,091 B2 * | 10/2004 | Saito ........................ | 365/173 |
| 7,098,495 B2 | 8/2006 | Sun et al. | |
| 7,233,039 B2 | 6/2007 | Huai et al. | |
| 7,474,514 B2 | 1/2009 | Nishioka et al. | |
| 7,572,645 B2 | 8/2009 | Sun et al. | |
| 7,772,659 B2 | 8/2010 | Rodmacq et al. | |
| 7,986,544 B2 | 7/2011 | Kent et al. | |
| 8,053,244 B2 | 11/2011 | Ryan et al. | |
| 8,063,460 B2 | 11/2011 | Nikonov et al. | |
| 8,450,818 B2 * | 5/2013 | Nikonov et al. ............ | 257/421 |
| 2005/0040438 A1 | 2/2005 | Dobisz et al. | |
| 2007/0076469 A1 | 4/2007 | Ashida et al. | |
| 2008/0074799 A1 | 3/2008 | Ishiwata | |

(Continued)

FOREIGN PATENT DOCUMENTS

| JP | 2010-206023 A | 9/2010 |
|---|---|---|
| KR | 10-2010-0091158 A | 8/2010 |

(Continued)

OTHER PUBLICATIONS

Corrected Notice of Allowance received for U.S Appl. No. 12/456,581, mailed on Mar. 19, 2013, 2 pages.

(Continued)

*Primary Examiner* — Calvin Lee
(74) *Attorney, Agent, or Firm* — Forefront IP Lawgroup, PLLC

(57) ABSTRACT

Methods of forming spin torque microelectronic devices are described. Those methods may include forming a free FM layer on a substrate, forming a non-magnetic layer on the free FM layer, forming at least three input pillars on the non-magnetic layer, and forming an output pillar on the non-magnetic layer to form a majority gate device.

10 Claims, 16 Drawing Sheets